United States Patent [19]

Ishigaki et al.

[11] 3,873,932

[45] Mar. 25, 1975

[54] GAIN CONTROL CIRCUIT HAVING VARIABLE IMPEDANCE TO DETERMINE CIRCUIT GAIN AND TO CONTROL MINIMUM GAIN

[75] Inventors: Yoshio Ishigaki; Masayuki Hongu, both of Tokyo; Hiromi Kawakami, Yokohama, all of Japan

[73] Assignee: Sony Corporation, Tokyo, Japan

[22] Filed: Nov. 8, 1973

[21] Appl. No.: 413,897

[30] Foreign Application Priority Data

Nov. 9, 1972 Japan .............................. 47-112309

[52] U.S. Cl. ......................... 330/20, 330/22, 330/29

[51] Int. Cl. ............................................... H03g 3/30

[58] Field of Search ........................... 330/20, 29, 22

[56] References Cited

UNITED STATES PATENTS

| | | | |
|---|---|---|---|
| 3,395,357 | 7/1968 | Ketchledge | 330/29 |
| 3,516,003 | 6/1970 | Boone | 330/20 |
| 3,581,222 | 5/1971 | Dunwoodie | 330/29 |
| 3,706,937 | 12/1972 | Hanna | 330/29 |
| 3,708,699 | 1/1973 | Frei et al. | 330/29 |
| 3,737,796 | 6/1973 | Legler | 330/29 |
| 3,803,505 | 4/1974 | Ishigaki et al. | 330/29 |

*Primary Examiner*—Stanley D. Miller, Jr.
*Attorney, Agent, or Firm*—Lewis H. Eslinger; Alvin Sinderbrand

[57] ABSTRACT

A gain control circuit in which a variable impedance to control the gain is placed in parallel with a relatively constant current circuit, and the constant current is proportional to the signal voltage to be controlled. These parallel-connected components are connected in series with an impedance in the emitter circuit of a common base amplifier. A load impedance is connected in the collector circuit of the amplifier and the output signal is derived across the load.

12 Claims, 9 Drawing Figures

GAIN CONTROL CIRCUIT HAVING VARIABLE IMPEDANCE TO DETERMINE CIRCUIT GAIN AND TO CONTROL MINIMUM GAIN

BACKGROUND OF THE INVENTION

1. Field of The Invention

This invention relates to the field of gain control amplifiers and particularly to gain control amplifiers in which the minimum gain is controlled without requiring a limiter for the control signal.

2. The Prior Art

Gain control amplifiers utilizing differentially connected amplifiers have heretofore been commonly used. In such circuits, two transistors are connected differentially with a load impedance in the collector circuit of one of them and with a third transistor connected as a constant current circuit in the emitter circuits of the differentially connected transistors. The signal to be controlled is applied to the base of the third transistor to control the flow of current therethrough. The controlling signal is applied differentially to the bases of the first two transistors so that as the base of one of them receives a voltage that makes that transistor become increasingly conductive, the base of the other transistor receives a voltage that causes it to become correspondingly less conductive.

One of the disadvantages of this kind of circuit is that an excess control voltage can cause one or the other of the differentially connected transistors to become saturated or to reach cut-off. In either case, it can become difficult to control the minimum output voltage to be derived across the load. Accordingly, it has been common practice to include a limiter in the circuit that supplies the control signal so that the voltage swing of this signal cannot exceed a value that will permit the differentially connected transistors to operate properly. This limiter circuit adds further expense and complication to the entire circuit. Further, the signal-to-noise characteristics of that type of gain control circuit are deteriorated.

It is one of the objects of the present invention to provide a gain control circuit that has better signal-to-noise characteristics than the circuits used heretofore and also has better control of the minimum gain, or maximum attenuation of the signal to be controlled.

Further objects will become apparent from the following specification together with the drawings.

SUMMARY OF THE INVENTION

In accordance with the present invention an amplifier to amplify a signal is connected as a common-base amplifier with a load impedance in its collector circuit. In the emitter circuit is another impedance, preferably in the form of a resistor having relatively large resistance and connected in series with a parallel circuit that comprises a constant current circuit. The magnitude of the current in the latter circuit is not a fixed value but is controlled by the signal whose gain is to be controlled. In parallel with this constant current circuit is a variable impedance, the magnitude of which is controlled by the control signal that determines the gain of the signal to be controlled.

DETAILED DESCRIPTION OF THE INVENTION

Figures 1, 2, 3:
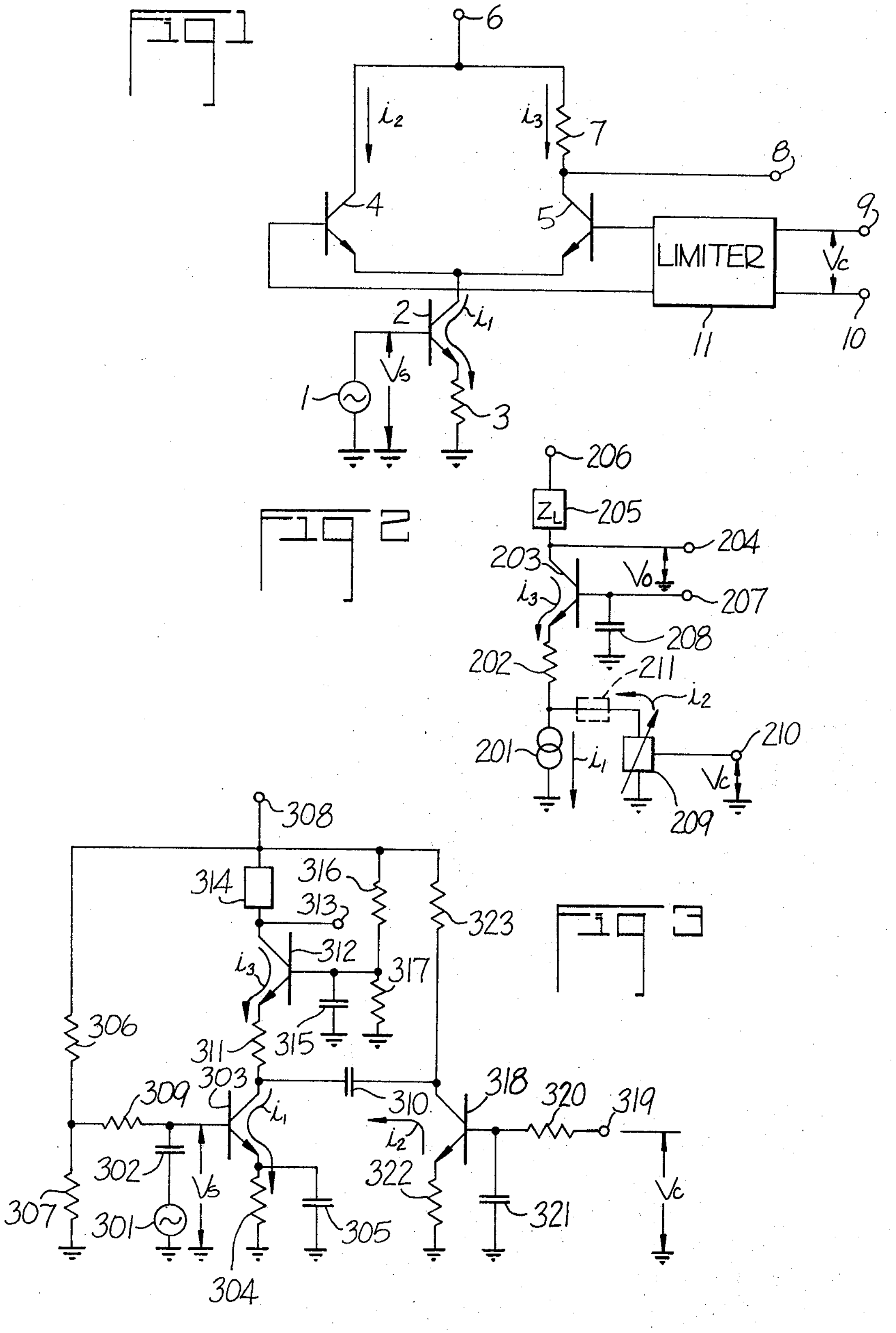
FIG. 1 is a schematic diagram of a prior art control circuit.
FIG. 2 is a basic circuit diagram of a gain control circuit according to the present invention.
FIGS. 3–8 are schematic diagrams of various embodiments of gain control circuits constructed according to the invention.

In FIG. 1 a source 1 of a signal to be controlled is connected between ground and the base of a transistor 2. An emitter resistor 3 is connected in the emitter circuit of the transistor 2 between the emitter and ground. The collector-emitter circuit of the transistor 2 forms a substantially constant current circuit for current passing therethrough but is under the control of the signal applied from the source 1 so that the magnitude of the constant current is determined by the voltage output $V_s$ applied between the base of the transistor 2 and ground.

The collector of the transistor 2 is connected to the emitters of two differentially connected transistors 4 and 5. The collector of the transistor 4 is connected directly to a power supply terminal 6 while the collector of the transistor 5 is connected to the power supply terminals through a load resistor 7. An output terminal 8 is connected to a common point between the load resistor 7 and the collector of the transistor 5.

A control voltage $V_c$ is connected across two input terminals 9 and 10 and is applied by way of a limiter 11 to the bases of the transistors 4 and 5 in differential form so that as the voltage at the base of the transistor 4 increases, the voltage at the base of the transistor 5 decreases, and vice-versa.

In the operation of the prior art circuit shown in FIG. 1, the signal current that flows through the transistor 2 is indicated as $i_1$ and the currents through the collector-emitter circuits of the transistors 4 and 5 are, respectively, $i_2$ and $i_3$. Since the transistor 2 forms a constant current circuit, the following relationship is true:

$$i_1 = i_2 + i_3 \quad (1)$$

In this circuit, the ratio of the current $i_2$ to the current $i_3$ is determined by the bias conditions on the transistors 4 and 5, and these bias conditions are, in turn, determined by the control signal $V_c$.

The output voltage across the load 7 is given by the equation:

$$V_{eo} = i_3 \times R_7 \quad (2)$$

where $R_7$ is the impedance value of the component 7, and in this instance is a resistance.

In this circuit the maximum reduction, or attenuation of the signal $V_s$ is determined by the maximum value of the control signal $V_c$ that is passed through the limiter 11. The maximum attenuation of this gain control circuit is determined by the maximum amplitude of the control voltage $V_c$. If the signal $V_c$ has peaks that exceed a certain value, the output signal, representing an attenuated value of the input signal $V_s$ is zero. The limiter 11 limits the maximum value of control signal applied to the transistors 4 and 5 and thus determines the maximum attenuation of the circuit in FIG. 1.

The signal-to-noise ratio of the signal $V_s$ is also deteriorated in the circuit shown in FIG. 1. It is well known that the base spreading resistance $r_{bb'}$ of a transistor acts as a noise source. Furthermore, the gain of an amplifier connected as a common-emitter amplifier, as is the transistor 5, is basically determined by the ratio of the load impedance to the impedance in the emitter circuit. If the gain of the circuit shown in FIG. 1 is reduced by applying a control voltage of higher amplitude to the base electrode of the transistor 4 so as to reduce the impedance of this transistor, the signal applied to the base of the transistor 5 will be reduced. This reduction causes a reduction in the current $i_3$ through the load 7, and thus, a reduction in the voltage across the load. In this condition, the noise signal generated at the base spreading resistance $r_{bb'}$ of the transistor 5 is amplified more effectively by the transistor 5 connected as a common emitter amplifier. The more the signal $V_s$ is attenuated in response to the control signal $V_c$, the more the gain of the transistor 5 relative to the noise signal generated at the base spreading resistor of the transistor 5 increases. In addition, a separate noise signal is generated at the base of the spreading resistance of the transistor 4, and this second noise signal also appears at the collector of the transistor 5 by being coupled from the emitter of the transistor 4 to the emitter of the transistor 5. This further reduces the signal-to-noise ratio of the output signal at the terminal 8.

FIG. 2 shows a fundamental circuit configuration according to the present invention. In the circuit in FIG. 2, a signal current source 201 is of the constant current type and has a current $i_1$ flowing through it. This current source is connected in series with a resistor 202 of relatively high resistance, and the series circuit comprising these two elements is connected between the emitter of the transistor 203 and a common terminal, such as ground. The transistor 203 is connected as a common-base amplifier and has an output terminal 204 connected to its collector. A load impedance 205 having a magnitude $Z_L$ is connected between the collector of the transistor 203 and a power supply terminal 206.

A suitable bias voltage is connected to a base terminal 207 of the transistor 203 and a capacitor 208 is connected between the base of this transistor and ground so that for the purpose of the alternating voltage signal to be amplified by the transistor 203, the base is at ground potential.

A variable impedance 209 is connected in parallel with the current source 201 and has an input terminal 210. The voltage control signal $V_c$ is connected between the terminal 210 and ground to control the impedance of the variable 209.

In operation of the circuit in FIG. 2, the current $i_1$ is of a constant value and is still determined by Equation (1), where $i_2$ is the current through the variable impedance 209 and $i_3$ is the current through the amplifier 203. Furthermore, it is preferred that the impedance of the resistor 202 be relatively large compared to the equivalent impedance seen from the emitter of the transistor 203. The upper end of the resistor 202 may be considered, for a simplified calculation, to be connected directly to ground for alternating voltage signals, because the equivalent AC impedance seen from the emitter of the transistor 203 is very small. This means that the resistor 202 is effectively in parallel with the variable impedance 209 with reference to the current source 201, and so the voltage across the resistor 202 is equal to the voltage across the variable impedance 209. Equation (2) is thus applicable to this circuit because the voltage drop across the load impedance 205 is due to the flow of current $i_3$ through it. Since the current $i_2$ is equal to the difference between the current $i_1$ and the current $i_3$, equation (2) may be revised by substituting $i_1 - i_3$ for $i_2$ to yield the following:

$$i_3 R_{202} = i_1 Z_{209} - i_3 Z_{209} \quad (3)$$

Transposing the terms having $i_3$ in them to the same side of the equals sign yields $$i_3 (R_{202} + Z_{209}) = i_1 Z_{209} \quad (4)$$

Dividing both sides by $(R_{202} + Z_{209})$ gives $$i_3 = \left(\frac{Z_{209}}{R_{202} + Z_{209}}\right) \times i_1. \quad (5)$$

The voltage $V_0$ across the load impedance $Z_L$ is determined by the current $i_3$ through it:

$$V_0 = Z_L \quad i_3 = \frac{Z_L Z_{209}}{R_{202} + Z_{209}} \times i_1. \quad (6)$$

Since both the resistor 202 and the load impedance 205 are constant, the output signal $V_0$, which represents the reduced value of the input signal $V_s$, is varied by varying the impedance of the variable impedance 209.

This impedance is controlled in response to the control signal $V_c$ applied to it. If the control signal $V_c$ is large enough to make the variable impedance $Z_{209}$ very small, the output voltage $V_0$ becomes zero when the control signal $V_c$ exceeds a certain value. This value can be less than the maximum excursion of the signal $V_c$ and any further increase in the magnitude of $V_c$ may cause the impedance $Z_{209}$ to approach more closely to zero but will not change the output voltage $V_0$.

One means of limiting the minimum value of the total impedance connected in parallel with the current source 201 is to place an impedance element 211 in series with the impedance 209. Then if the impedance $Z_{209}$ is reduced to zero, the current source 201 will not be short circuited. This impedance 211 is shown in dotted lines because it is not necessary that it be included in the circuit except to form a minimum impedance.

The effect of including the impedance 211 in the circuit is to make the minimum output voltage $$V_{0_{min}} = \frac{Z_L \quad Z_{211}}{R_{202} + Z_{211}} i_1. \quad (7)$$

By making the resistance of the resistor 202 large, the noise generated at the base spreading resistance of the transistor 203 is not amplified so much and therefore does not have a high amplitude at the output terminal 204. Due to the relatively low ratio $Z_L/R_{202}$ of the impedance $Z_L$ of the load 205 to the resistance $R_{202}$ of the resistor 202 in this common base amplifier, the amplification factor for noise generated in the base-spreading resistance of the transistor 203 is not large. The high resistance value of the resistor 202 also prevents any noise signal generated at the current source 201 and at the variable impedance device 209 or any other part of the emitter circuit of the transistor 203 from being amplified substantially by the transistor.

It is an important part of the circuit according to the present invention that the resistor 202 interposed between the transistor 203 and the signal current source 201. Various modifications of this basic circuit will be described hereinafter.

One such modification is shown in FIG. 3 in which a signal source of 301 of the signal to be controlled is connected by way of a capacitor 302 to a transistor 303 that operates as a constant current device. This transistor has a parallel-connected resistor 304 and capacitor 305 in its emitter circuit between the emitter and ground. The base of the transistor 303 is biased by a voltage divider comprising a resistor 306 and another resistor 307 connected in series between the power supply terminal 308 and ground. The common connection between the resistors 306 and 307 is connected by means of a resistor 309 to the base of the transistor 303.

The collector of the transistor 303 is connected to a capacitor 310 and to a relatively high resistance resistor 311. The other end of the resistor 311 is connected to the emitter of a gain control transistor 312. The collector of this transistor is connected to an output signal terminal 313 and to one end of a load impedance 314, the end of which is connected to a power supply terminal 308.

The transistor 312 operates as a common-base amplifier and has a capacitor 315 connected between its base and ground so that the base is at ground potential for alternating current signals. Bias for the transistor 312 is obtained by means of a voltage divider comprising a resistor 316 and another resistor 317 connected in series between the power supply terminal 308 and ground. The base of the transistor 312 is connected to the common connection between these two resistors.

The controlled impedance that controls the amplification of signals by the transistor 312 includes a transistor 318, the collector of which is connected to the capacitor 310 and the base of which is connected to an input terminal 319 by means of a resistor 320. The control voltage $V_c$ is applied between the terminal 319 and ground, and since this control voltage has a relatively low frequency, a capacitor 321 is connected between the base of the transistor 318 and ground. A resistor 322 is connected between the emitter of the transistor 318 and ground.

As stated, the transistor 312 operates as a common-base amplifier relative to the signal current. When the value of the control voltage $V_c$ is low, the transistor 318 operates in its active region and the AC equivalent impedance seen from its collector is extremely high so that the current $i_3$ is almost equal to the signal $i_1$, and the current $i_2$ is practically equal to zero. In this state, the gain control circuit has its maximum gain and the amplitude of the output signal at the terminal 313 is a maximum.

As the control voltage $V_c$ increases, the transistor 318 becomes increasingly conductive so that the equivalent impedance of the transistor seen from its collector has a lower impedance. The collector-base junction of the transistor 318 has the greatest effect on the impedance value of the transistor as a variable impedance device. If the control voltage $V_c$ becomes sufficiently high, this junction will become forward-biased and its impedance will be very low, almost zero. In that case, the signal current $i_2$ will flow through the capacitor 310 and the capacitor 321, and the impedance represented by these capacitors in series determines the maximum gain reduction of the circuit. At intermediate values of the control voltage $V_c$, the impedance-versus-control voltage characteristics of the transistor 312 as a variable impedance device are also influenced by the impedance of the collector-emitter circuit of the transistor 318, and these characteristics may be changed by selecting the resistor 322 to hav the proper impedance. However, if the resistor 322 is chosen to have a very high impedance, the signal path from the collector of the transistor 318 to ground through the resistor 322 has little effect in explaining the operation of the circuit. This would be true if the resistor 322 has a resistance of as much as 500 ohms. The values of the components in FIG. 3 are as follows:

| | | | |
|---|---|---|---|
| capacitor 302 | 1000pF | resistor 307 | 2.2Kohms |
| capacitor 305 | 1000pF | resistor 309 | 5K ohms |
| capacitor 310 | 100pF | resistor 311 | 500 ohms |
| capacitor 315 | 1000pF | resistor 314 | 1K ohm |
| capacitor 321 | 1000pF | resistor 316 | 6.8K ohms |
| resistor 304 | 500 ohms | resistor 317 | 5.1K ohms |
| resistor 306 | 9.1K ohms | resistor 320 | 10K ohms |
| | | resistor 322 | 2K ohms |
| | | resistor 323 | 10K ohms |

Handling frequency: 58:75 MHz

Variation of the control signal $V_c$: from 2.5v. to 3.5v.

Maximum gain reduction: −24db∼−25db when $V_c$ exceeds 3.5v.

Figures 4, 5:
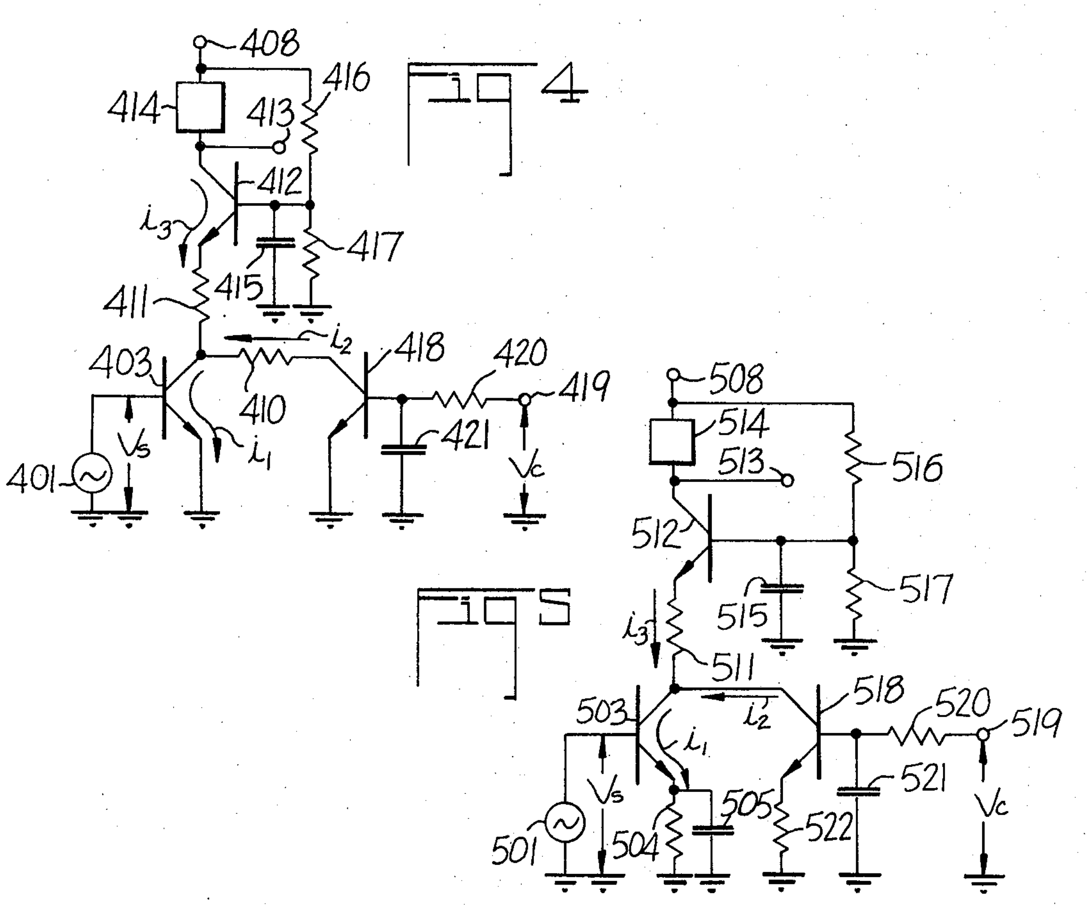

FIG. 4 shows another embodiment of the invention in which the section of the circuit through which the signal passes includes a signal source 401 connected between the base and emitter input terminals of a transistor 403 that serves as a constant current device. The collector of the transistor 403 is connected to a resistor 410 and to a second resistor 411. The resistor 411 is connected in series with the emitter-collector circuit of a transistor 412 in a common-base configuration. An output terminal 413 is connected to the collector of the transistor 412 and a load impedance 414 is connected between the collector of the transistor 412 and a power supply terminal 498. The base of the transistor 412 is connected to ground for alternating current by way of a capacitor 415, and bias is supplied to the base by a voltage divider comprising two resistors 416 and 417 connected in series between the power supply terminal 408 and ground.

The control section of the circuit includes the resistor 410 connected in series with the emitter-collector circuit of a transistor 418. The base of the transistor 418 is connected to an input terminal 419 to which the control voltage $V_c$ is applied. Between the base of the transistor 418 and the terminal 419 is a series resistor 420. A capacitor 421 is shunted across the base-emitter terminals of the transistor 418.

The operation of the circuit in FIG. 4 is somewhat different from that in FIG. 3 due to the fact that there is direct current coupling between the control transistor 418 and the constant current circuit comprising the transistor 403. As a result, the bias condition on the transistor 418 affects the bias condition of the transistor 403 so that the signal $i_1$ is also changed in response to the control voltage $V_c$. Thus, a desired relationship between the gain of the circuit and the control voltage $V_c$ can be obtained in the circuit of FIG. 4 in the same manner as the control of this relationship was determined by the resistor 322 in FIG. 3. In the circuit in FIG. 4, the fact that the emitter electrode of the transistor 418 is directly connected to ground is the equivalent of making the resistor 322 in FIG. 3 equal to zero.

The impedance between the collector and the emitter electrode of the transistor 418 becomes important in any calculation of the gain of the circuit. When the voltage $V_c$ is applied to the terminal 419 becomes high enough, the impedance between the collector and the emitter of the transistor 418 drops almost to zero so that the resistor 410 is important in setting the maximum gain reduction of the circuit.

Another embodiment of the invention is shown in FIG. 5 in which a signal source 501 supplies the signal voltage to the base of the transistor 503 that acts as a constant current device. A resistor 504 and a capacitor 505 are connected in parallel between the emitter of the transistor 503 and ground. A relatively high impedance resistor 511 is connected between the collector of the transistor 503 and the emitter of the transistor 512 that is connected as a common-base amplifier. An output terminal 513 is connected to the collector of the transistor 512 and a load impedance 514 connects the collector to a power supply terminal 508. As in previous embodiments, the base of the transistor 512 is connected to ground for alternating current by way of a capacitor 515, and the bias on the transistor 512 is determined by a voltage divider comprising the resistors 516 and 518 connected in series between the power supply terminal 508 and ground.

The collector of a vairable impedance transistor 518 is connected directly to the common connection between the collector of the transistor 503 and the resistor 511. An input terminal 519 is provided for supplying the control voltage $V_c$ to the transistor 518 by way of a series-connected resistor 520 that connects the base of the transistor 518 to the input terminal 519.

A relatively small capacitor 521 is connected between the base of the transistor 518 and ground, and a resistor 522 which has a relatively high value, for example, 500 ohms, is connected between the emitter of the transistor 518 and ground.

The impedance value of the transitor 521 determines the maximum gain reduction of the circuit in FIG. 5. For example, if the capacitor has a capacitance of about 100pF, it has an impedance of about 27 ohms at a handling frequency of 58.75MHz, which is typical for a circuit to handle IF signals in a television receiver. If the magnitude of the voltage $V_c$ goes to a sufficiently high level, the current $i_2$ flows through the collector-base junction of the transistor 518 and the capacitor 521, which has a considerably lower impedance than the resistor 522.

Figure 6:
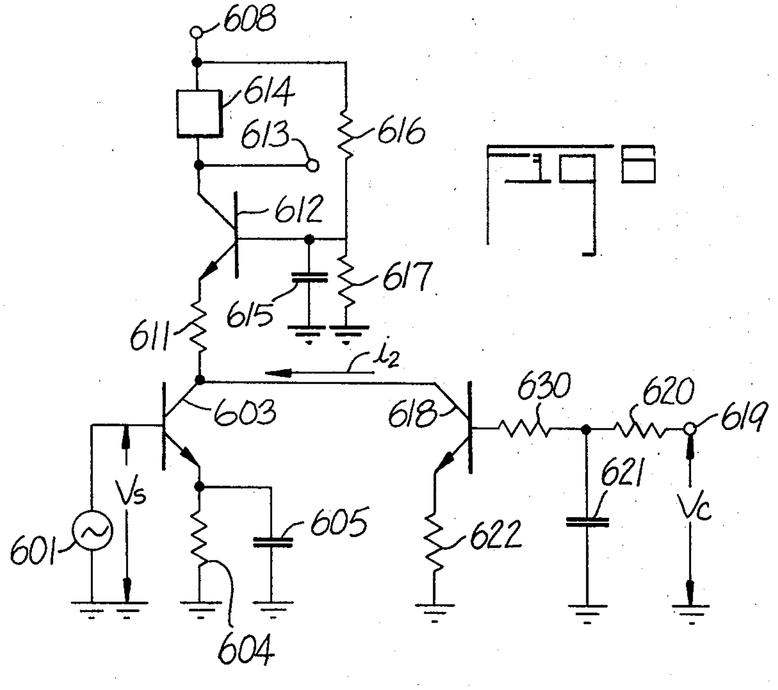

FIG. 6 shows a circuit similar to that in FIG. 5 with the addition of a resistor 630 connected between the base of the variable impedance control transistor 618 and the capacitor 621.

If the capacitance of the capacitor 621 is chosen to be relatively large, for example, 1,000pF, it will have a low impedance, and the maximum gain reduction of the circuit will depend on the value of the resistor 630. At a frequency of 58.75MHz, the impedance of a 1,000pF capacitor 621 would be about 217 ohms. If the resistance of the resistor 622 is relatively high, the current $i_2$ will flow through the base-collector circuit of th transistor 618 and through the resistor 630. The resistance of the resistor 604 will also affect the relationship between the gain and control voltage characteristics of the circuit.

Figure 7:
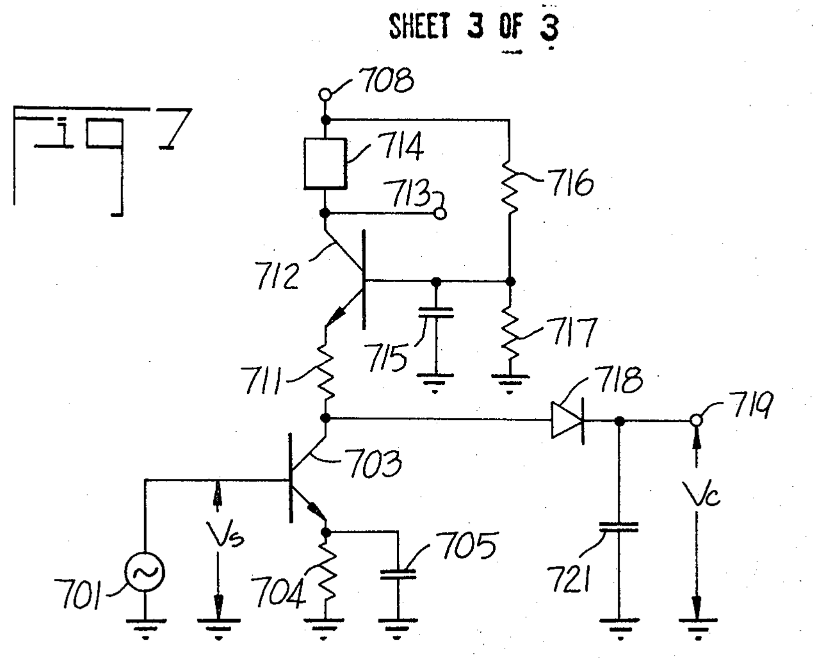

FIG. 7 shows a still further embodiment of the invention in which the amplifying portion of the circuit is the same as in FIGS. 5 and 6 but the control portion has a diode 718 connected to the collector of the constant current transistor 703. The cathode of the diode 718 is connected to an input terminal 719 for receiving a control voltage $V_c$, and a capacitor 712 is connected between the cathode and the diode 718 and ground.

Typical values for the circuit components in FIG. 7 are as follows:

| | | | |
|---|---|---|---|
| Capacitor 205 | 1000pF, | Resistor 704 | 500 ohms |
| Capacitor 715 | 1000pF, | Resistor 711 | 500 ohms |
| Capacitor 721 | 1000pF, | Resistor 714 | 1K ohms |
| | | Resistor 716 | 6.8K ohms |
| | | Resistor 717 | 5.1K ohms |

Handling Frequency: 58.75MHz
changing extent of the control signal $V_c$
: From 215V. to 1.8V.

The impedance of the value of the diode 718 can be changed, or controlled, in response to the control voltage $V_c$. In this circuit the maximum gain reduction of the signal applied from the source 701 to the transistor 703 and taken at the output terminal 713 is achieved when the control voltage $V_c$ drops to about 1.8 volts. The impedance characteristics are reversed relative to the control voltage $V_c$ as compared with the characteristics in the preceding circuits. The maximum gain reduction is determined by the impedance of the capacitor 721 to the signal from the source 701.

Figure 8:
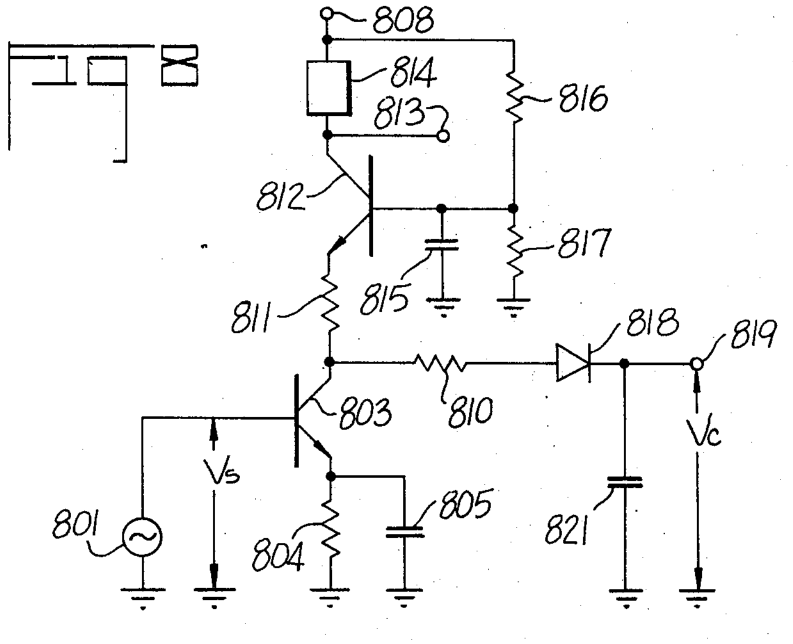

FIG. 8 shows another embodiment similar to that in FIG. 7 but with the addition of a resistor 810 connected in series between the collector of the transistor 803 and the anode of the diode 818. As in the circuit in FIG. 7, the maximum gain reduction is achieved when the control voltage $V_c$ reaches approximately 1.8 volts. Then the resistance of the resistor 810 and the impedance of the capacitor 821 determine the maximum gain reduction of the signal voltage between the source 801 and the output terminal 813.

Figure 9:
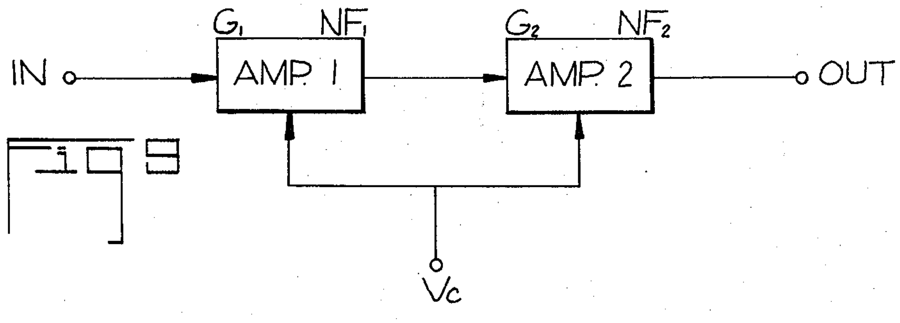
FIG. 9 is a block diagram of a two-stage gain control circuit utilizing the features of the present invention.

One of the advantages of the present invention is that it is useful in designing a multistage gain control circuit such as an IF circuit in which the gain is controlled by an automatic gain control signal. FIG. 9 shows the basic configuration of such a circuit in which the two amplifiers 901 and 902 may be any of the amplifiers in accordance with the present invention as described for example, in connection with FIGS. 2 through 8.

Generally speaking the noise figure of an amplifier gets worse, that is, increases, in proportion to the reduction of the gain of the signal through the amplifier. In a two-stage gain control circuit, as shown in FIG. 9, the gain of each stage is controlled in response to a common control signal $V_c$ applied thereto. The total noise figure for the circuit is as follows:

$$NF_{total} = NF_1 + \frac{NF_2}{G_1} \qquad (8)$$

As a result, if the overall maximum gain of the two stages is to be −50db, it is more desirable to select the maximum gain reduction of the first stage 901 to be less than that of the second stage 902 rather than to have the gain reduction of each of these stages be the same.

What is claimed is:

1. A gain control circuit comprising:

a signal current source;

a first transistor connected as a common base amplifier the gain of which is to be controlled;

impedance means connecting the emitter of said first transistor to said signal current source;

a load connected to the collector of said first transistor; and a variable impedance connected in parallel with said signal current source to control the ratio of signal current through said first transistor to the signal current through said source; said signal current source comprising a second transistor having its emitter-collector circuit connected in series between said impedance means and ground, and including a signal voltage source connected to the base of said second transistor.

2. The gain control circuit of claim 1 in which the impedance of said impedance means is substantially greater than theimpedance of said load plus the impedance between the emitter and the impedance of said first transistor.

3. The gain control circuit of claim 1 in which said signal current is alternating current of a predetermined frequency and said impedance means is substantially resistive at said frequency.

4. The gain control circuit of claim 1 in which said variable impedance comprises a series circuit that comprises the emitter-collector circuit of a control transistor connected in parallel with the emitter-collector circuit of said second transistor.

5. The gain control circuit of claim 4 in which said series circuit comprises a resistor.

6. The gain control circuit of claim 4 in which said series circuit comprises a capacitor.

7. The gain control circuit of claim 6 comprising, in addition a second capacitor connected between the base of said control transistor and ground.

8. The gain control circuit of claim 5 comprising, in addition, a capacitor connected between the base of said control transistor and ground.

9. The gain control circuit of claim 4 comprising, in addition:

A. a resistor connected between the emitter of the control transistor and ground; and B. a capacitor connected in series between the base of the control transistor and ground.

10. The gain control circuit of claim 9 comprising, in addition a resistor connected in series between the base of said control transistor and said capacitor.

11. The gain control circuit of claim 1 in which said variable impedance comprises a diode connected in series with a capacitor between the collector of the second transistor and ground, said control circuit comprising, in addition, a control voltage input terminal connected to a common circuit point between said diode and said capacitor, 12. The gain control circuit of claim 11 comprising, in addition, a resistor connected in series with said diode between the collector of said second transistor and said common circuit point.

* * * * *